(12) United States Patent
Lim et al.

(10) Patent No.: US 7,054,204 B2
(45) Date of Patent: May 30, 2006

(54) SEMICONDUCTOR DEVICE AND METHOD FOR CONTROLLING THE SAME

(75) Inventors: Jong-hyoung Lim, Suwon-si (KR); Hyuk-joon Kwon, Gunpo-si (KR); Hyun-kyu Lee, Yongin-si (KR)

(73) Assignee: Samsung Electronic Co., Ltd., (KR)

( * ) Notice: Subject to any disclaimer, the term of this patent is extended or adjusted under 35 U.S.C. 154(b) by 32 days.

(21) Appl. No.: 10/828,454

(22) Filed: Apr. 20, 2004

(65) Prior Publication Data

US 2005/0030798 A1    Feb. 10, 2005

(30) Foreign Application Priority Data

Aug. 8, 2003    (KR) ........................ 10-2003-005014

(51) Int. Cl.
*G11C 7/00* (2006.01)
*G11C 8/00* (2006.01)

(52) U.S. Cl. ........................ 365/190; 365/233; 365/236

(58) Field of Classification Search ........... 365/189.05, 365/189.08, 190, 207, 230.06, 230.08, 233, 365/236, 194, 205, 208
See application file for complete search history.

(56) References Cited

U.S. PATENT DOCUMENTS

| | | | | |
|---|---|---|---|---|
| 5,844,849 | A * | 12/1998 | Furutani | ...................... 365/194 |
| 6,172,918 | B1 * | 1/2001 | Hidaka | ........................ 365/190 |
| 6,208,580 | B1 * | 3/2001 | Ozeki | .......................... 365/233 |
| 6,229,744 | B1 * | 5/2001 | Hsiao et al. | ................. 365/203 |

FOREIGN PATENT DOCUMENTS

KR    1998-071162    10/1998

\* cited by examiner

*Primary Examiner*—Trong Phan
(74) *Attorney, Agent, or Firm*—Mills & Onello LLP

(57) ABSTRACT

Disclosed herein are a semiconductor method and device which are capable of reducing data write errors by rewriting last write data during a write recovery time (tWR). The semiconductor device comprises a memory cell array consisting of a plurality of repetitive cell units; a bit line amplifier for amplifying a voltage difference between a bit line voltage and a complementary bit line voltage of the memory cell array; switching devices activated by a column selection line signal for electrically connecting a data line and a complementary data line to the bit line and the complementary bit line, respectively; and a write driver for supplying a write data voltage to the data line and the complementary data line, wherein the column selection line signal is generated during a write recovery time. The method for controlling the semiconductor device including a memory cell array having a plurality of repetitive cell units, a bit line amplifier for amplifying a voltage difference between a bit line voltage and a complementary bit line voltage of the memory cell array, switching devices activated by a column selection line signal for electrically connecting a data line and a complementary data line to the bit line and the complementary bit line, respectively, and a write driver for supplying a write data voltage to the data line and the complementary data line, comprises the steps of: writing data voltage into the memory cell array; and generating the column selection line signal during a write recovery time.

31 Claims, 9 Drawing Sheets

SEMICONDUCTOR DEVICE AND METHOD FOR CONTROLLING THE SAME

BACKGROUND OF THE INVENTION

This application claims the priority of Korean Patent Application No. 10-2003-0055014 filed on Aug. 8, 2003, in the Korean Intellectual Property Office, the disclosure of which is incorporated herein by reference.

1. Field of the Invention

The present invention relates to a semiconductor device, and more particularly, to a semiconductor device and method for controlling the same, which is capable of reducing data write errors by rewriting last write data during a write recovery time (tWR).

2. Description of the Related Art

In general, a write recovery time (tWR) is defined as a time until a read or write operation is enabled after a previous write operation of a semiconductor device, that is, the time period when last data are written to when a pre-charge command signal is input.

Particularly, the write recovery time (tWR) is represented by the number of clocks, such as by tWR=2 clocks or tWR=3clocks, in synchronous semiconductor devices, for example, a Synchronous Dynamic Random Access Memory (SDRAM), or a Double Data Rate Synchronous Dynamic Random Access Memory (DDR SDRAM), and particularly, is several or more clocks in higher speed synchronous semiconductor devices.

Conventionally, as there is a risk of erroneous operation when read or write operations are performed under the state that the semiconductor devices do not secure sufficient write recovery time (tWR), memory cell arrays for storing write data voltages and write drivers for supplying the write data voltages are electrically separated from each other.

Accordingly, the conventional semiconductor devices are supplied with the write data voltages only through column lines connected to the memory cell arrays during the write recovery time (tWR).

In conventional semiconductor devices, however, the write recovery time (tWR) should be lengthened in order to sufficiently supply a last write data voltage for the memory cell arrays. If that is not done, there is a risk of the occurrence of errors in the last data write, particularly if the last write data conflict with stored data.

SUMMARY OF THE INVENTION

A feature of the present invention is to provide a semiconductor device, which is capable of sufficiently supplying last data voltage to memory cell arrays by repeatedly activating only a column line into which the last data are written during a write recovery time (tWR).

According to one aspect of the present invention, there is provided a semiconductor device, comprising: a memory cell array having a plurality of cell units; a bit line amplifier for amplifying a voltage difference between a bit line voltage and a complementary bit line voltage of the memory cell array; switching devices activated by a column selection line signal for electrically connecting a data line and a complementary data line to the bit line and the complementary bit line, respectively; and a write driver for supplying a write data voltage to the data line and the complementary data line, wherein the column selection line signal is generated during a write recovery time.

In one embodiment, the column selection line signal is repetitively generated during the write recovery time.

In one embodiment, the semiconductor device further comprises a signal generator for generating the column selection line signal, wherein the signal generator is activated by a signal derived from an AND operation of an AND gate with respect to a column selection line enable signal and a column address selection signal activated by a column address signal and is deactivated by a column selection line disable signal, for generating the column selection line signal.

In one embodiment, the column selection disable signal is generated after the column selection line enable signal is generated.

In one embodiment, the column selection line disable signal is generated with a delay by at least half of the period of the column selection line enable signal, compared to the column selection line enable signal.

In one embodiment, the signal generator comprises: a first PMOS transistor into which a signal derived from an AND operation of an AND gate with respect to the column selection line enable signal and the column address selection signal is input; an NMOS transistor into which the signal derived from the AND operation of the AND gate with respect to the column selection line enable signal and the column address selection signal is input; a second PMOS transistor connected between the first PMOS transistor and the NMOS transistor and into which an inverted signal of the column selection line disable signal is input; and an inverter connected to a point between the second PMOS transistor and the NMOS transistor.

In one embodiment, the signal generator further comprises a second inverter connected to the inverter via a latch.

In one embodiment, the column selection line enable signal is generated by an AND operation of an AND gate with respect to the write enable signal and a master clock signal.

In one embodiment, the column selection line disable signal is generated by an AND operation of an AND gate with respect to the master clock signal after a predetermined delay time and the write enable signal activated by an inverted signal of the master clock signal.

In one embodiment, the semiconductor device further comprises a signal generator for generating the write enable signal, wherein the signal generator is activated by a write command signal and is deactivated by a stop signal of a column address burst counter.

In one embodiment, the signal generator comprises: a first NOR gate into which the write command signal is input; a second NOR gate connected to the first NOR gate via a latch and into which the stop signal of the column address burst counter is input; and an inverter connected to an output terminal of the first NOR gate.

In one embodiment, the stop signal of the column address burst counter is generated with a delay by at least one clock of a master clock signal after a start of the write recovery time.

In one embodiment, the stop signal of the column address burst counter is generated with a delay in proportion to a value of the write recovery time.

In one embodiment, the stop signal of the column address burst counter is activated by a write recovery time enable signal.

In one embodiment, the semiconductor device further comprises a signal generator for generating the write recovery time enable signal, wherein the signal generator comprises: a PMOS transistor into which an inverted signal of a write recovery time determination signal is input; an NMOS transistor into which the inverted signal of the write recovery time determination signal is input; a fuse connected between the PMOS transistor and the NMOS transistor; and an inverter connected to a connection point between the fuse and the NMOS transistor.

In one embodiment, the signal generator further comprises a second inverter connected to the inverter via a latch.

In one embodiment, an internal column address signal is generated after the column address signal is generated after a predetermined delay time.

In one embodiment, the column address signal is reset by the stop signal of the column address burst counter.

In one embodiment, the column address signal is activated by a column address set signal and is generated after the predetermined delay time.

In one embodiment, the column address signal is activated by a signal derived from an AND operation of an AND gate with respect to the master clock signal and an inverted signal of the column address set signal and the internal column address signal is generated.

In one embodiment, the column address signal is generated during at least one clock of the master clock signal after a start of the write recovery time.

In one embodiment, the column address signal is generated in proportion to a value of the write recovery time.

In one embodiment, the column address set signal is activated by the write enable signal and is deactivated after a predetermined delay time.

According to another aspect of the present invention, there is provided a method of controlling a semiconductor device including a memory cell array consisting of a plurality of cell units, a bit line amplifier for amplifying a voltage difference between a bit line voltage and a complementary bit line voltage of the memory cell array, switching devices activated by a column selection line signal for electrically connecting a data line and a complementary data line to the bit line and the complementary bit line, respectively, and a write driver for supplying a write data voltage to the data line and the complementary data line. The method includes the steps of: writing data voltage into the memory cell array and generating the column selection line signal during a write recovery time.

In one embodiment, the step of generating the column selection line signal includes generating the column selection line signal repetitively.

In one embodiment, the step of generating the column selection line signal includes activating the column selection line signal using the write enable signal.

In one embodiment, the step of generating the column selection line signal includes generating the write enable signal during at least one clock of a master clock signal after a start of the write recovery time.

In one embodiment, the step of generating the column selection line signal includes generating the write enable signal in proportion to a value of the write recovery time.

In one embodiment, the step of generating the column selection line signal includes deactivating the write enable signal using a stop signal of a column address burst counter.

In one embodiment, the step of generating the column selection line signal includes generating the stop signal of the column address burst counter with a delay by at least one clock of the master clock signal after the start of the write recovery time.

In one embodiment, the step of generating the column selection line signal includes generating the stop signal of the column address burst counter in proportion to a value of the write recovery time.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
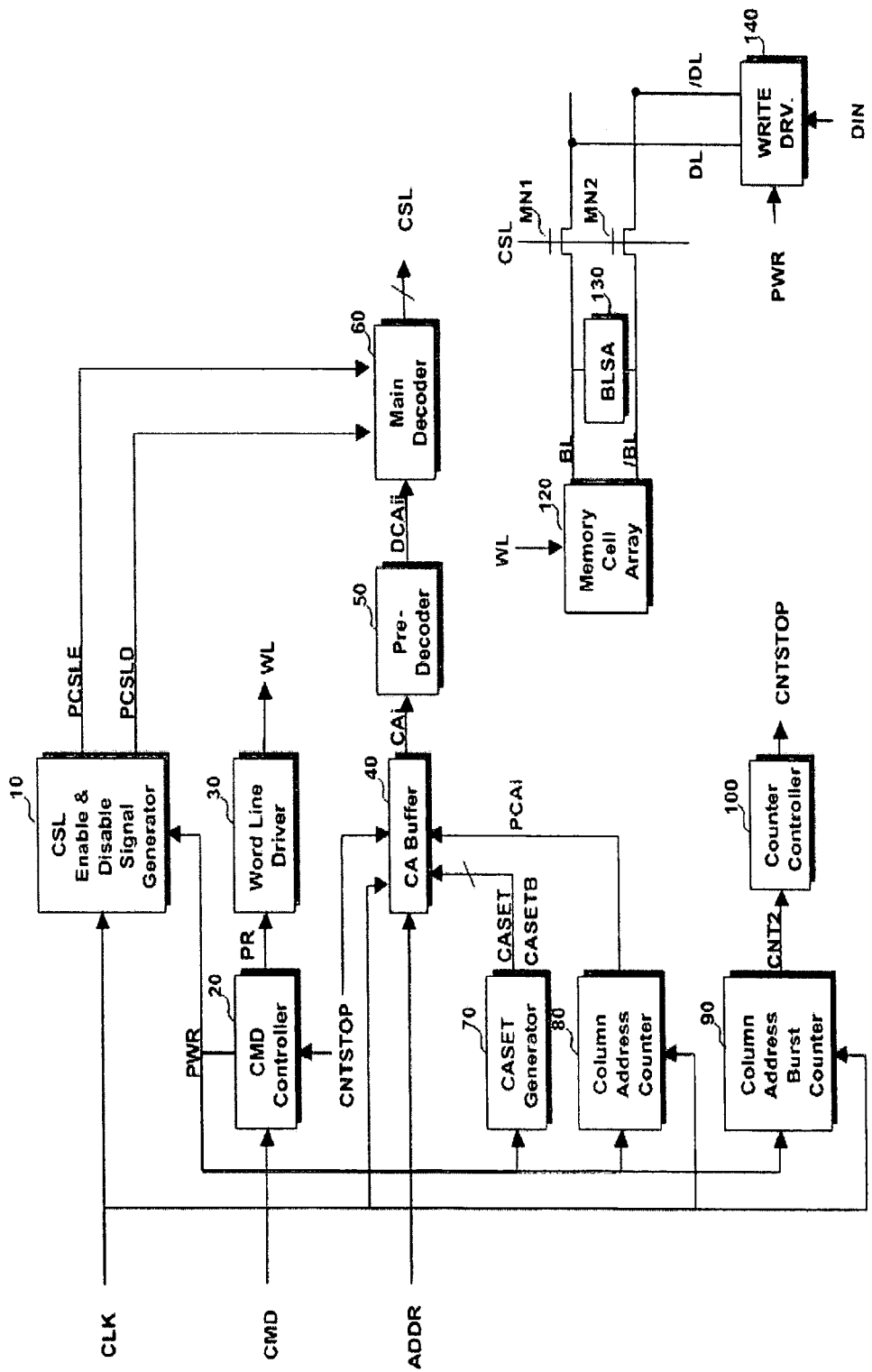
FIG. 1 is a block diagram showing a conventional semiconductor device.

FIG. 1 is a block diagram showing a conventional semiconductor device. As shown in FIG. 1, a semiconductor device generally includes a memory cell array 120 consisting of a plurality of repeated cell units, a bit line amplifier 130 for amplifying a voltage difference between a bit line BL voltage and a complementary bit line /BL voltage of the memory cell array 120, switching devices MN1 and MN2 for electrically connecting a data line DL and a complementary data line /DL to the bit line BL and the complementary bit line /BL respectively, and a write driver 140 for supplying a write data voltage to the data line DL and the complementary data line /DL.

The bit line BL and memory cells in the memory cell array 120 are electrically activated when a word line is activated by a word line signal WL, and accordingly, a write data voltage supplied from the write driver 140 is written into the memory cells via the bit line BL.

The bit line amplifier 130 amplifies the voltage difference between the bit line BL voltage and the complementary bit line /BL voltage and supplies the amplified voltage to the bit line BL when the write data voltage supplied from the write driver 140 is applied to the bit line BL.

The switching devices MN1 and MN2, which are activated by a column selection line signal CSL, electrically connect the data line DL and the complementary data line /DL to the bit line BL and the complementary bit line /BL, respectively.

The write driver 140, which is activated by a write enable signal PWR, supplies the write data DIN voltage supplied thereto to the data line DL and the complementary data line /DL.

A column selection line enable signal PCSLE and disable signal PCSLD generator 10, which is activated by a master clock signal CLK and a write enable signal PWR, supplies a column selection line enable signal PCSLE and a column selection line disable signal PCSLD to a main decoder 60.

A command signal controller 20 receives a command signal CMD and supplies a low master signal PR to a word line driver 30. In addition, this controller generates the write enable signal and is deactivated by a stop signal CNTSTOP of a column address burst counter. The word line driver 30, which is activated by the low master signal PR, supplies the word line signal to the memory cell array 120.

A column address buffer 40, which is activated by the master clock signal CLK, a column address set signal CASET and an inverted column address set signal CASETB and is reset by the stop signal CNTSTOP of the column address burst counter, receives an external address signal ADDR and an internal address signal PCAi and supplies a column address signal CAi to a pre-decoder 50.

The pre-decoder 50 receives the column address signal CAi and supplies a column address selection signal DCAij to the main decoder 60.

The main decoder 60, which is activated by the column selection line enable signal PCSLE and is deactivated by the column selection line disable signal PCSLD, receives the column address selection signal DCAij and generates the column selection line signal CSL.

A column address set signal CASET generator 70 receives the write enable signal PWR and generates the column address set signal CASET and the inverted column address set signal CASETB.

A column address counter 80, which is activated by the master clock signal CLK and the write enable signal PWR, generates the internal column address signal PCAi.

The column address burst counter 90, which is activated by the master clock signal CLK and the write enable signal PWR, supplies a third column address burst counter output signal CNT2 to a counter controller 100.

The counter controller 100 receives the third column address burst counter output signal CNT2 and generates the stop signal CNTSTOP of the column address burst counter.

In the conventional semiconductor device as constructed above, during the write recovery time (tWR), since the column selection line signal CSL is deactivated and the switching devices MN1 and MN2 are also deactivated if the write driver applies the last write data voltage to the bit line BL, the bit line BL and the complementary bit line /BL are electrically isolated from the data line DL and the complementary data line /DL, respectively.

Therefore, during the write recovery time (tWR), the last write data voltage applied to the bit line BL is applied to the memory cells of the memory cell array 120 only by the bit line amplifier 130.

In addition, as the word line signal WL is deactivated by a pre-charge signal PRE, the word line and the memory cells of the memory cell array 120 are electrically isolated from each other. At this time, the voltage of the bit line BL is determined to be the voltage of the memory cells of the memory cell array 120.

Figure 2:
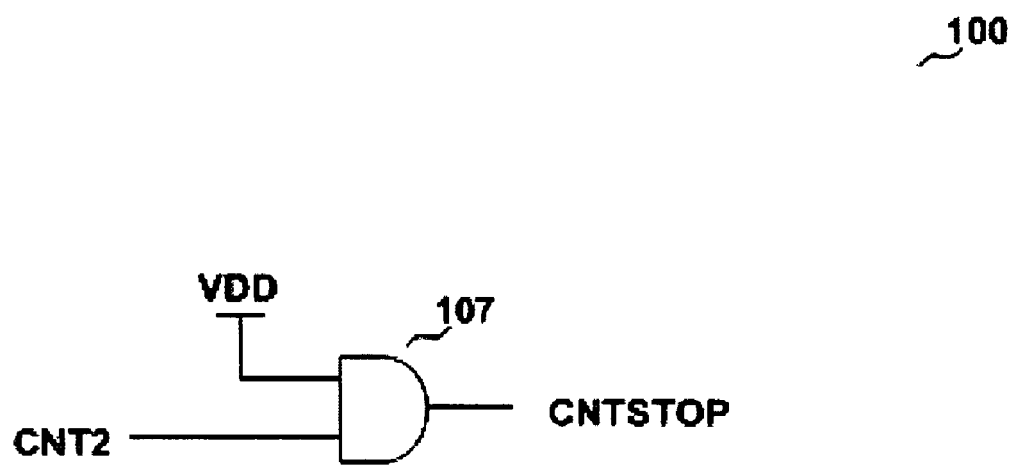
FIG. 2 is a circuit diagram showing a counter controller of the conventional semiconductor device.

FIG. 2 is a circuit diagram of the counter controller of the conventional semiconductor device. As shown in FIG. 2, the counter controller 100 always generates the stop signal CNTSTOP of the column address burst counter through an AND operation of an AND logic gate 107 with respect to the third column address burst counter output signal CNT2 and a power supply voltage signal VDD, regardless of a value of the write recovery time (tWR). FIG. 2 shows an operation circuit in the case that the length of data burst is 4.

Figure 3:
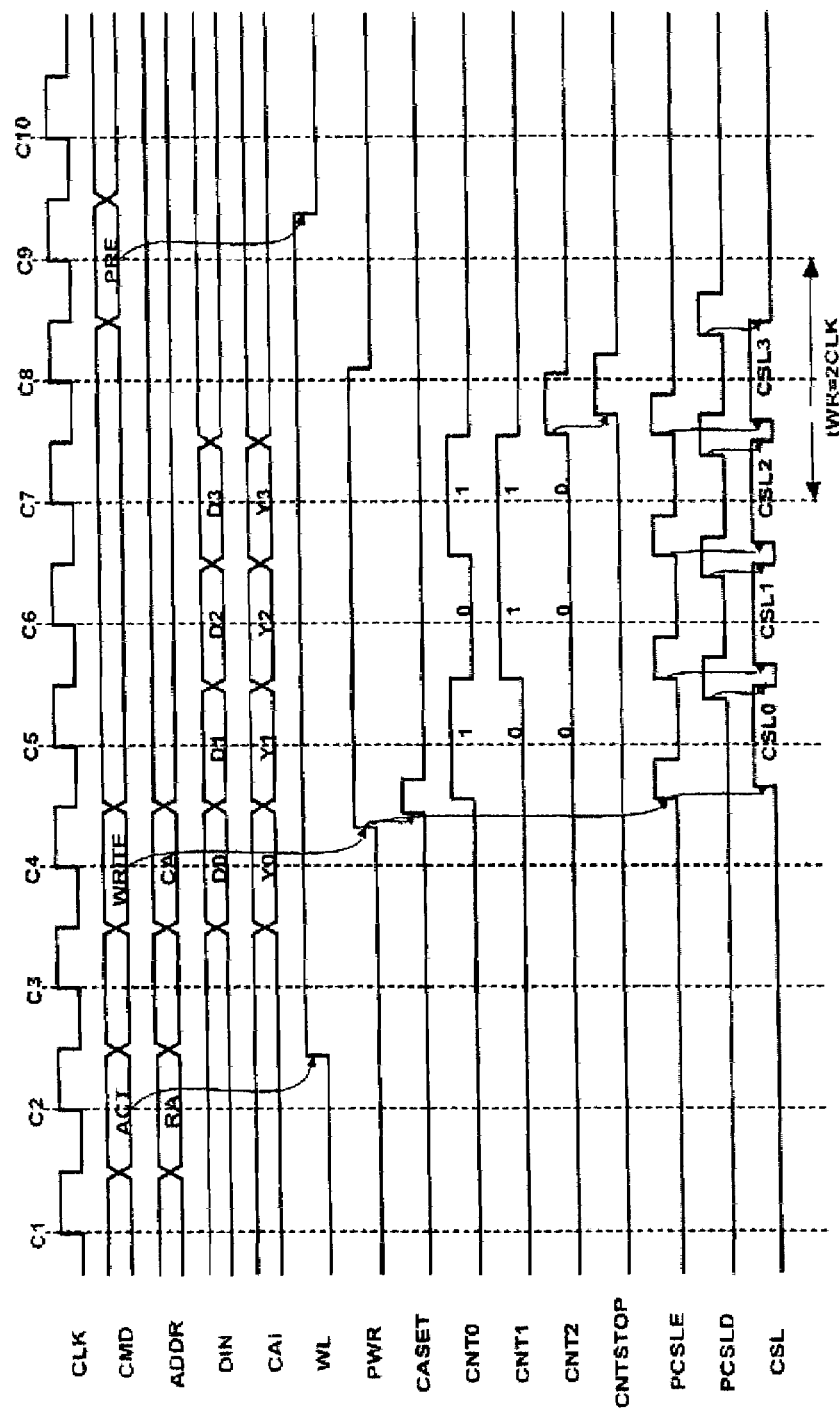
FIG. 3 is a timing diagram showing a write operation of the conventional semiconductor device (in the case of tWR=2 clocks).

FIG. 3 is a timing diagram showing a write operation of the conventional semiconductor device (in the case of tWR=2 clocks). In general, as shown in FIG. 3, when an activation command signal ACT and an external address signal RA are input at C2 of the master clock signal CLK, the master clock signal CLK having intervals C1–C10, the semiconductor device sets to be activated and the word line signal WL corresponding to the external address signal is activated. The word line signal WL is deactivated by the pre-charge command signal PRE.

When a write command signal WRITE and the external address signal CA are input at C4 of the master clock signal CLK, the column address signal CAi (Y0) into which first data D0 are written is activated. When the write command signal WRITE is input, the write enable signal PWR is activated, and accordingly the column address set signal CASET is activated.

Column address burst counter output signals CNT0, CNT1 and CNT2 are activated by the write enable signal PWR. The first column address burst counter output signal CNT0 is activated by counting the master clock signal CLK, the second column address burst counter output signal CNT1 is activated by counting the first column address burst counter output signal CNT0, and the third column address burst counter output signal CNT2 is activated by counting the second column address burst counter output signal CNT1.

After column address signal CAi (Y0) into which the first data D0 is written is activated, next column address signals Y1, Y2 and Y3 into which the next data D1, D2 and D3 are written are activated by the column address burst counter output signals CNT0, CNT1 and CNT2.

The stop signal CNTSTOP of the column address burst counter is activated by the third column address burst counter output signal CNT2, and accordingly the write enable signal PWR is deactivated.

The column selection line enable signal PCSLE and the column selection line disable signal PCSLD are activated by the write enable signal PWR, and the column selection line signal CSL is activated by the column selection line enable signal PCSLE and is deactivated by the column selection line disable signal PCSLD generating column selection line signals CSL0, CSL1, CSL2 and CSL3.

In the conventional semiconductor device, during the write recovery time (tWR), when the last data D3 are transferred to the bit line BL through the column selection line signal CSL, the column selection line signal CSL is deactivated, and accordingly the bit line BL and the data line DL are electrically isolated from each other.

Figure 4:
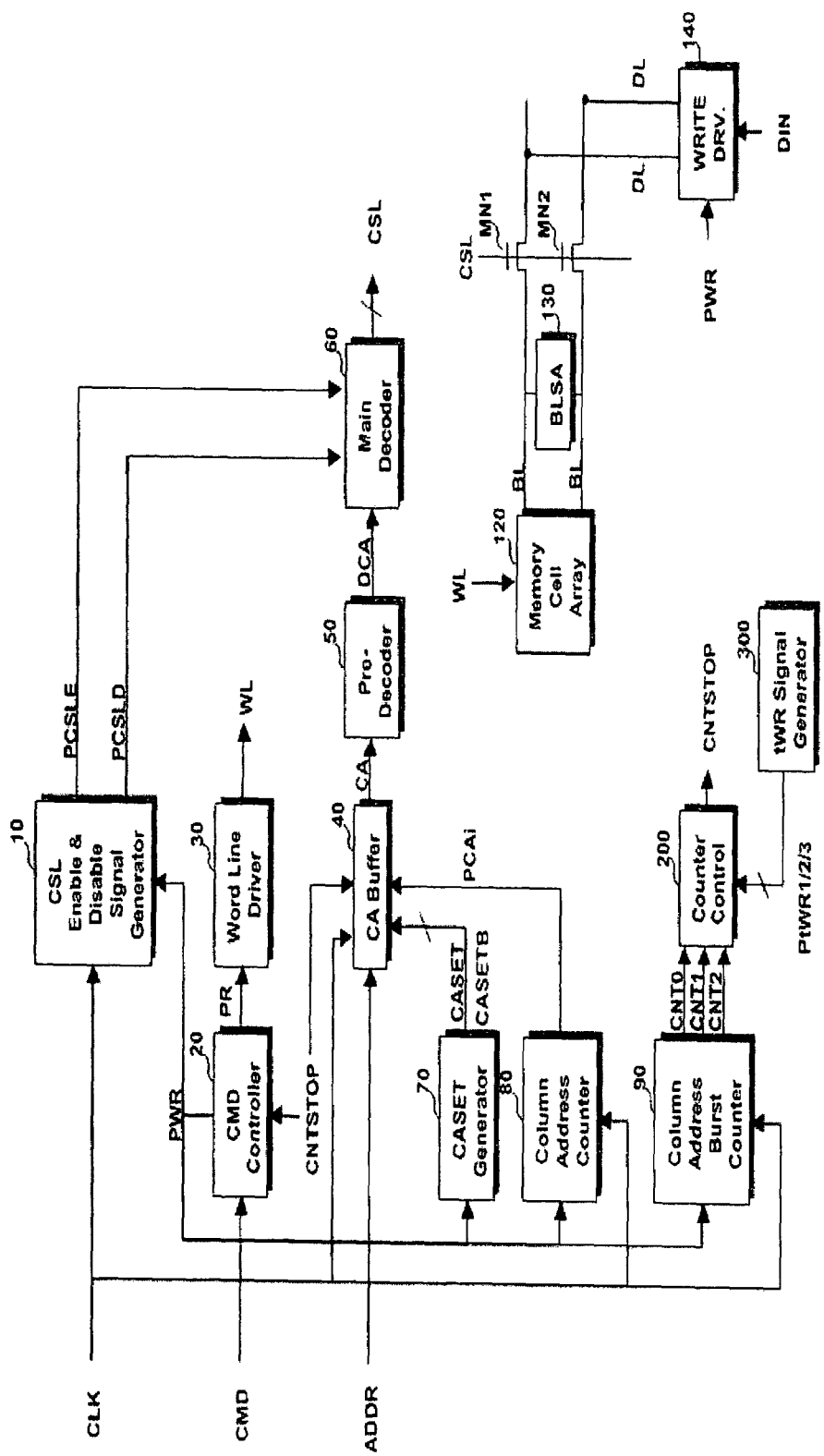
FIG. 4 is a block diagram illustrating a semiconductor device according to an embodiment of the present invention.

FIG. 4 is a block diagram illustrating a semiconductor device according to an embodiment of the present invention, where same reference numerals are given to same parts as FIGS. 1 to 3, the detailed description of which will not be repeated for the sake of simplicity.

A write recovery time (tWR) enable signal generator 300 supplies write recovery time (tWR) enable signals PtWR1, PtWR2 and PtWR3 to the counter controller 200 based on the value of the corresponding write recovery time (tWR).

The counter controller 200 provides the stop signal CNTSTOP of the column address burst counter through an AND operation with respect to the column address burst counter output signals CNT0, CNT1 and CNT2 and corresponding write recovery time (tWR) enable signals PtWR1, PtWR2 and PtWR3. The stop signal CNTSTOP of the column address burst counter is delayed in proportion to a value of the write recovery time (tWR). Accordingly, the command signal controller continues to generate the write enable signal PWR during the write recovery time (tWR).

The column address counter 80, which is activated by the master clock signal CLK and the write enable signal PWR, supplies the internal column address signal PCAi to the column address buffer 40. The column address counter 80 continues to generate the last signal of the internal column address signal PCAi for one or more cycles of the master clock signal CLK during the write recovery time (tWR). Accordingly, the column address buffer 40 continues to generate the last column address signal CAi for one or more clocks of the master clock signal CLK during the write recovery time (tWR).

Therefore, the main decoder 60 generates the last column selection line signal CSL3 during the write recovery time (tWR).

Compared to the conventional semiconductor device where the bit line BL voltage is supplied only by the bit line amplifier 130 during the write recovery time (tWR), the bit line BL voltage is supplied by the write driver 140 by repeatedly supplying the column selection line signal CSL during the write recovery time (tWR) in the semiconductor device according to the embodiment of the present invention.

Particularly, the write data voltage can be more effectively secured in the case that the last write data conflict with stored data.

Figure 5:
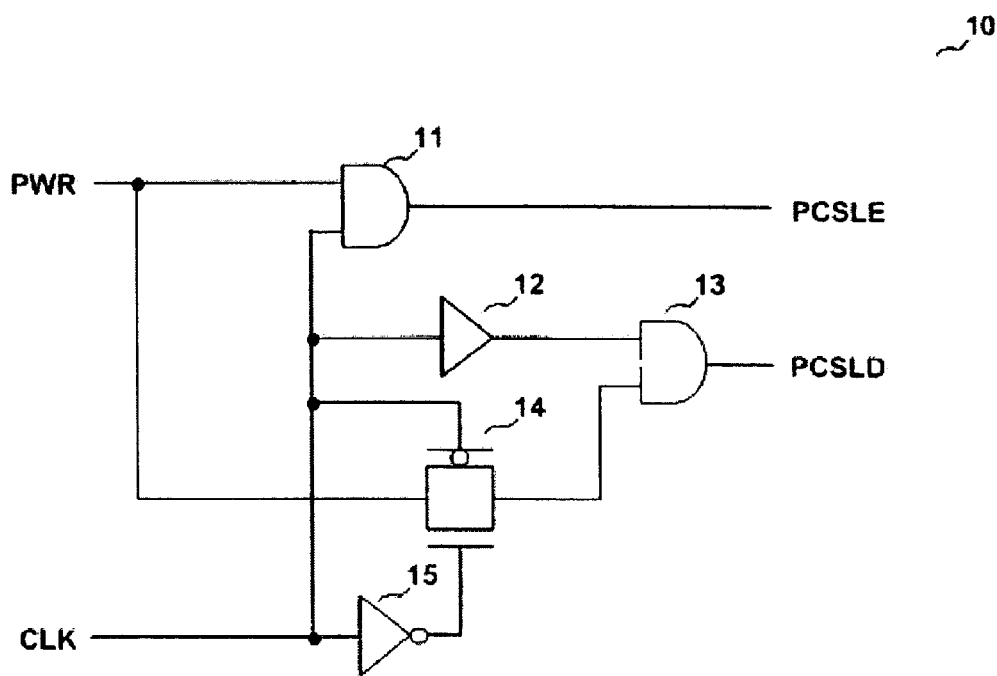
FIG. 5 is a circuit diagram illustrating an enable and disable signal generator for a column selection line signal in a semiconductor device according to an embodiment of the present invention.

FIG. 5 is a circuit diagram illustrating an enable and disable signal generator for a column selection line signal in a semiconductor device according to an embodiment of the present invention. As shown in FIG. 5, the column selection line enable signal PCSLE is generated by an AND operation of an AND gate 11 with respect to the write enable signal PWR and the clock signal CLK.

As shown in FIG. 5, the column selection line disable signal PCSLD is generated by an AND operation of an AND gate 13 with respect to the master clock signal CLK via a buffer 12 after a predetermined delay time and the write enable signal PWR via a transmission gate 14 activated both by the master clock signal CLK and an inverted signal of the master clock signal CLK inverted by inverter 15.

In this way, since the column selection line disable signal PCSLD is generated from the write enable signal PWR activated by the inverted signal of the master clock signal CLK, it can be generated with a delay later, compared to the column selection line enable signal PCSLE.

The column selection line disable signal PCSLD is preferably generated after being delayed by at least a half (½) of a period of the column selection line enable signal PCSLE, compared to the column selection line enable signal PCSLE.

Figure 6:
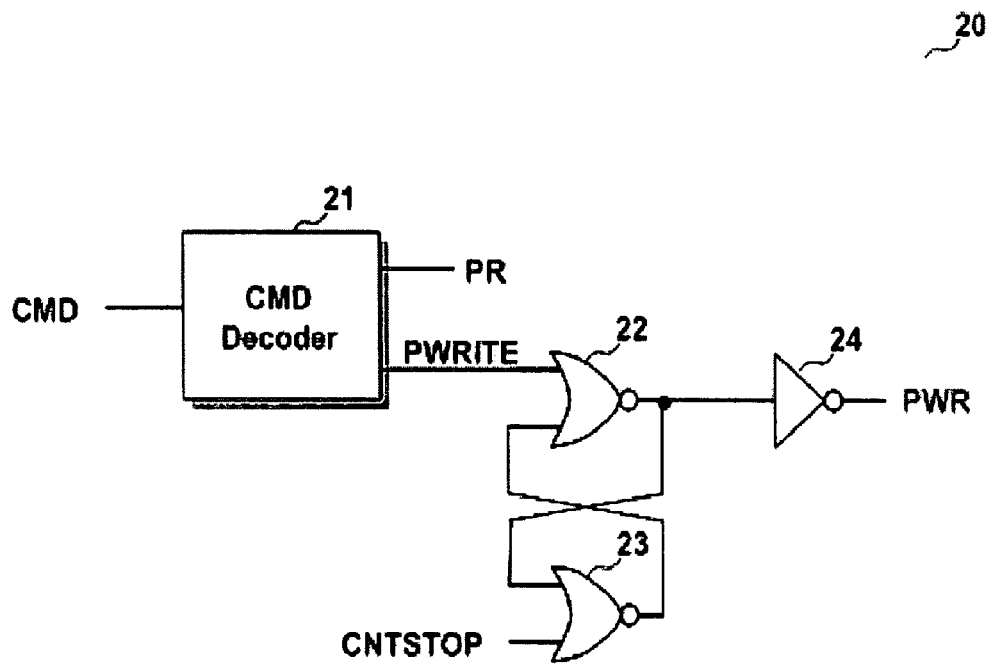
FIG. 6 is a circuit diagram illustrating a command signal controller in a semiconductor device according to an embodiment of the present invention.

FIG. 6 is a circuit diagram illustrating a command signal controller in a semiconductor device according to an embodiment of the present invention. The command signal controller 20, which is activated by a write command signal PWRITE defining a write operation in a command decoder 21 among command signals externally input and is deactivated by the stop signal CNTSTOP of the column address burst counter, generates the write enable signal PWR. Also, the command decoder 21 generates a low master signal PR to activate a word line driver 30.

As shown in FIG. 6, a signal generator for generating the write enable signal PWR can be configured to include a first NOR gate 22 into which the write command signal PWRITE is input, a second NOR gate 23 connected to the first NOR gate via a latch and into which the stop signal CNTSTOP of the column address burst counter is input, and an inverter 24 connected to an output terminal of the first NOR gate.

Figure 7:
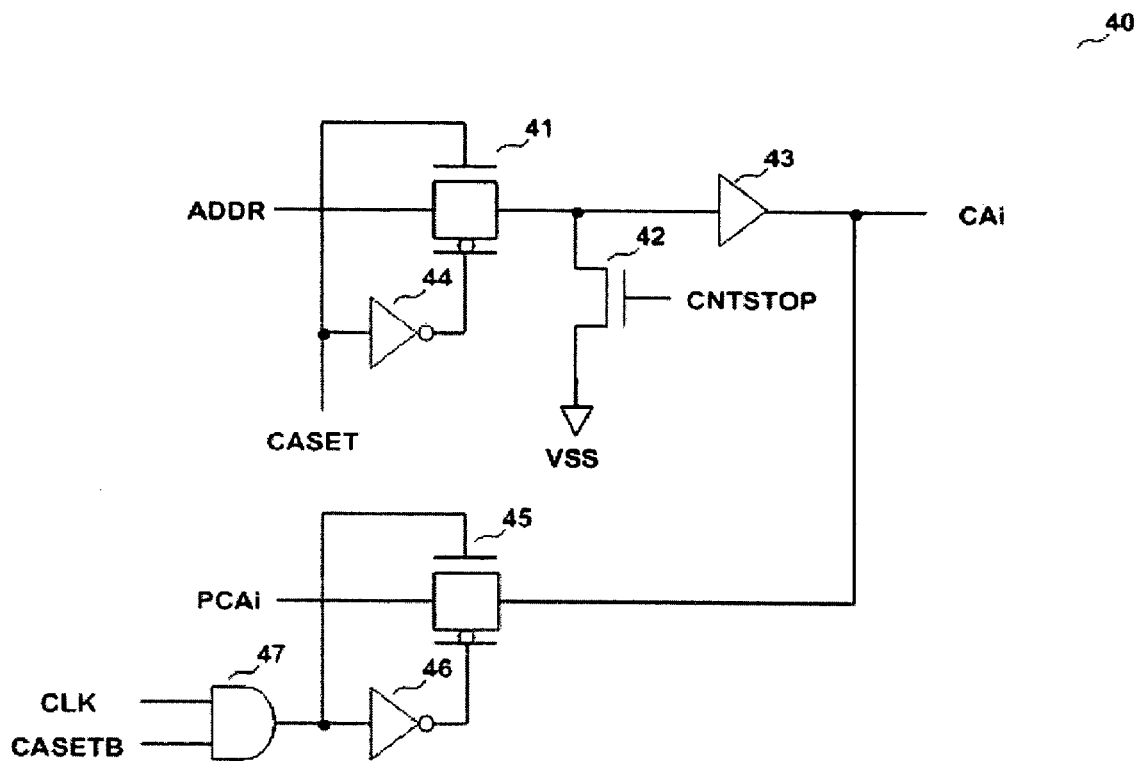
FIG. 7 is a circuit diagram illustrating a column address buffer in a semiconductor device according to an embodiment of the present invention.

FIG. 7 is a circuit diagram illustrating a column address buffer in a semiconductor device according to an embodiment of the present invention. As shown in FIG. 7, the column address buffer 40, which is reset by the stop signal CNTSTOP of the column address burst counter via an NMOS transistor 42 and is activated by the column address set signal CASET via a transmission gate 41, generates the column address signal CAi as the external address signal ADDR is transferred via a buffer 43 after a predetermined delay time. The column address set signal CASET inverted by inverter 44 is input to transmission gate 41.

After the column address buffer 40 generates the column address signal CAi by means of the external address signal ADDR, it is activated by a signal derived from and AND operation of an AND gate 47 with respect to the master clock signal CLK and an inverted signal of the column address signal CASET via a transmission gate 45 and generates the column address signal CAi as the internal column address signal PCAi is transferred. The signal derived from and AND operation of an AND gate 47 is inverted by inverter 46 and connected to transmission gate 45.

Figure 8:
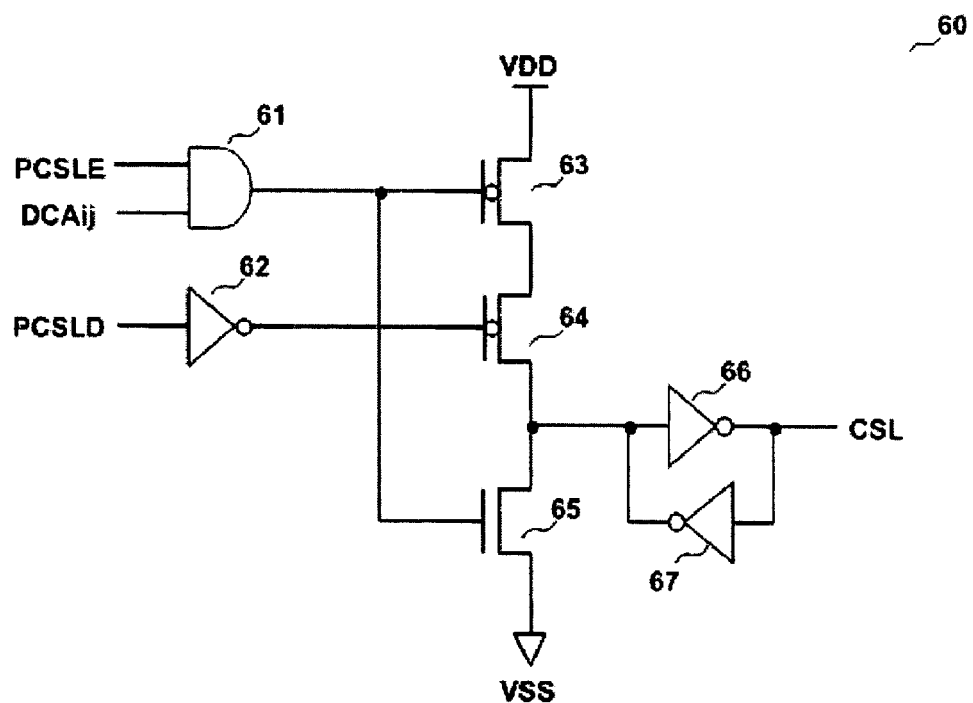
FIG. 8 is a circuit diagram illustrating a main decoder in a semiconductor device according to an embodiment of the present invention.

FIG. 8 is a circuit diagram illustrating a main decoder in a semiconductor device according to an embodiment of the present invention. The main decoder 60, which is activated by a signal derived from an AND operation of an AND gate 61 with respect to the column selection line enable signal PCSLE and a column address selection signal DCAij activated by the column address signal CAi and is deactivated by the column selection line disable signal PCSLD, generates the column selection line signal CSL.

As shown in FIG. 8, the main decoder 60 includes a first PMOS transistor 63 into which a signal derived from an AND operation of an AND gate 61 with respect to the column selection line enable signal PCSLE and the column address selection signal DCAiJ is input, an NMOS transistor 65 into which the signal derived from the AND operation of the AND gate 61 with respect to the column selection line enable signal PCSLE and the column address selection signal DCAij is input, a second PMOS transistor 64 connected between the first PMOS transistor 63 and the NMOS transistor 65 and into which an inverted signal of the column selection line disable signal PCSLD inverted by inverter 62 is input, and an inverter 66 connected to a point between the second PMOS transistor 64 and the NMOS transistor 65.

When the column selection line enable signal PCSLE and the column address selection signal DCAij are both high, the signal derived from the AND operation for them becomes high, and accordingly the first PMOS transistor 63 turns off and the NMOS transistor 65 turns on. Accordingly, as the input of the inverter 66 remains low, the column selection line signal CSL is activated.

When the column selection line disable signal PCSLD is high, a low signal as an inverted signal is input into the second PMOS transistor 64, and accordingly the second PMOS transistor 64 turns on. Accordingly, as the input of the inverter 66 remains high, the column selection line signal CSL is deactivated.

As the column selection line disable signal PCSLD is activated by the write enable signal PWR enabled by the inverted signal of the master clock signal CLK, it can be generated with a delay compared to the column selection line enable signal PCSLE.

Then, the column selection line signal CSL can be deactivated by the column selection line disable signal PCSLD after the column selection line signal CSL is activated by the column selection line enable signal PCSLE.

As described above, the column selection line disable signal PCSLD is preferably generated after being delayed by at least a half (½) of the period of the column selection line enable signal PCSLE, compared to the column selection line enable signal PCSLE.

As charges are shared at a connection point between the second PMOS transistor 64 and the NMOS transistor 65 by further connecting the inverter 66 to a second inverter 67 via a latch, the column selection line signal CSL can be prevented from floating, a condition in which the logic state of the signal cannot be determined.

Since the second inverter 67 latches the column selection line signal CSL, widths of a PMOS transistor and an NMOS transistor constructing the second inverter 67 are preferably designed to be smaller than those in the inverter 66 for facilitating transition of the column selection line signal CSL.

The column address selection signal DCAij, which is a signal decoded via the pre-decoder 50, has column address information required to select one of a plurality of column lines.

Figure 9:
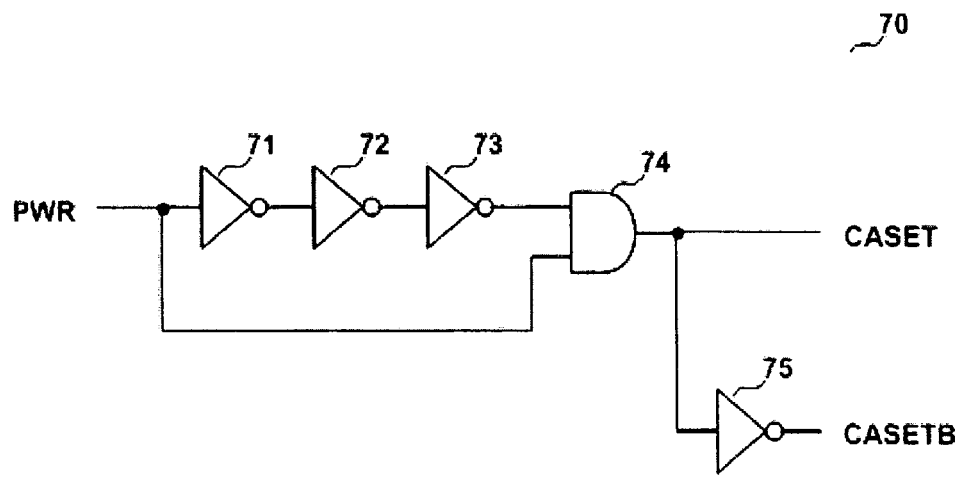
FIG. 9 is a circuit diagram illustrating a column address set signal generator in a semiconductor device according to an embodiment of the present invention.

FIG. 9 is a circuit diagram illustrating a column address set signal CASET generator in a semiconductor device according to an embodiment of the present invention. The column address set signal CASET is activated by the write enable signal PWR and is deactivated after a predetermined delay time.

As shown in FIG. 9, the column address set signal CASET generator 70 generates the column address set signal CASET through an AND operation of an AND gate 74 with respect to the write enable signal PWR and an output signal from the three inverters 71, 72 and 73 in series (a chain of inverters) into which the write enable signal PWR is input and inverted column address set signal CASETB is generated by inverting the column address set signal CASET by inverter 75.

When the write enable signal PWR is activated, since the output signal from the chain of inverters 71, 72 and 73 is deactivated after a predetermined delay time, the column address set signal CASET is activated during the delay time.

Since the delay time of the write enable signal PWR increases in proportion to the number of inverters in the chain of inverters 71, 72 and 73, the column address set signal CASET generator 70 can adjust a time when the column address set signal CASET is activated by adjusting the number of inverters in the chain of inverters 71, 72 and 73.

Only when the number of inverters in the chain of inverters 71, 72 and 73 is odd, the column address set signal CASET can be deactivated after the predetermined delay time.

Figure 10:
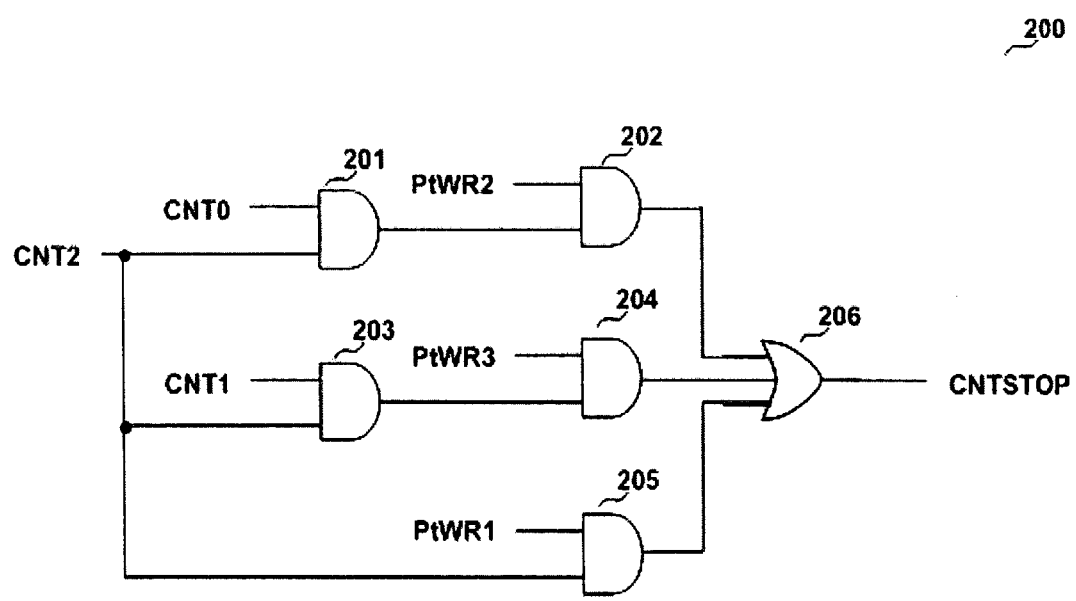
FIG. 10 is a circuit diagram illustrating a counter controller in a semiconductor device according to an embodiment of the present invention.

FIG. 10 is a circuit diagram illustrating a counter controller in a semiconductor device according to an embodiment of the present invention. As shown in FIG. 10, the counter controller 200 generates the stop signal CNTSTOP of the column address burst counter through an AND operation of an AND gate 205 with respect to the third column address burst counter output signal CNT2 and a corresponding write recovery time (tWR) enable signal PtWR1 in the case that the write recovery time (tWR) is 1 (one clock).

The counter controller 200 generates the stop signal CNTSTOP of the column address burst counter through an AND operation of an AND gate 202 with respect to a signal derived from an AND operation of an AND gate 201 with respect to the first column address burst counter output signal CNT0 and the third column address burst counter output signal CNT2 and a corresponding write recovery time enable signal PtWR2 in the case that the write recovery time (tWR) is 2 (two clocks), and generates the stop signal CNTSTOP of the column address burst counter through an AND operation of an AND gate 204 with respect to a signal derived from an AND operation of an AND gate 203 with respect to the second column address burst counter output signal CNT1 and the third column address burst counter output signal CNT2 and a corresponding write recovery time enable signal PtWR3 in the case that the write recovery time (tWR) is 3 (three clocks). The outputs of the AND gates 201, 204 and 205 are connected by an OR gate 206 which outputs the stop signal CNTSTOP.

The column address burst counter output signals CNT0, CNT1 and CNT2 are activated by the write enable signal PWR. The first column address burst counter output signal CNT0 is generated by counting the master clock signal CLK, the second column address burst counter output signal CNT1 is generated by counting the first column address burst counter output signal CNT0, and the third column address burst counter output signal CNT2 is generated by counting the second column address burst counter output signal CNT1.

Accordingly, the second column address burst counter output signal CNT1 is generated with a delay by one clock of the master clock signal CLK, compared to the first column address burst counter output signal CNT0, and a generation period of the signal CNT1 is two times that of the first column address burst counter output signal CNT0.

Similarly, the third column address burst counter output signal CNT2 is generated with a delay by one clock of the master clock signal CLK, compared to the second column address burst counter output signal CNT1, and a generation period of the signal CNT2 is two times that of the second column address burst counter output signal CNT1.

Accordingly, in the case that the write recovery time (tWR) is 2 (two clocks), the stop signal CNTSTOP of the column address burst counter is generated with a delay by one clock of the master clock signal CLK, compared to the case that the write recovery time (tWR) is 1 (one clock), and in the case that the write recovery time (tWR) is 3 (three clocks), the stop signal CNTSTOP of the column address burst counter is generated with a delay by one clock of the master clock signal CLK, compared to the case that the write recovery time (tWR) is 2 (two clocks).

In a similar way, in the counter controller 200, a fourth column address burst counter output signal is generated with a delay by one clock of the master clock CLK, compared to the third column address burst counter output signal CNT2, and has two times a generation period of the third column address burst counter output signal CNT2. Also, the stop signal CNTSTOP of the column address burst counter is generated through an AND operation of an AND gate with respect to a signal derived from an AND operation of an AND gate with the fourth column address burst counter output signal and the third column address burst counter output signal CNT2, and a corresponding write address time enable signal PtWR4. Accordingly, in the case that the write recovery time (tWR) is 4 (four clocks), a generation time of the stop signal CNTSTOP of the column address burst counter can be delayed by one clock of the master clock signal CLK, compared to the case that the write recovery time (tWR) is 3 (three clocks).

In this way, the counter controller 200 can generate the stop signal CNTSTOP of the column address burst counter with a delay by the clocking number of the master clock signal CLK in proportion to values of a plurality of write recovery time (tWR).

Figure 11:
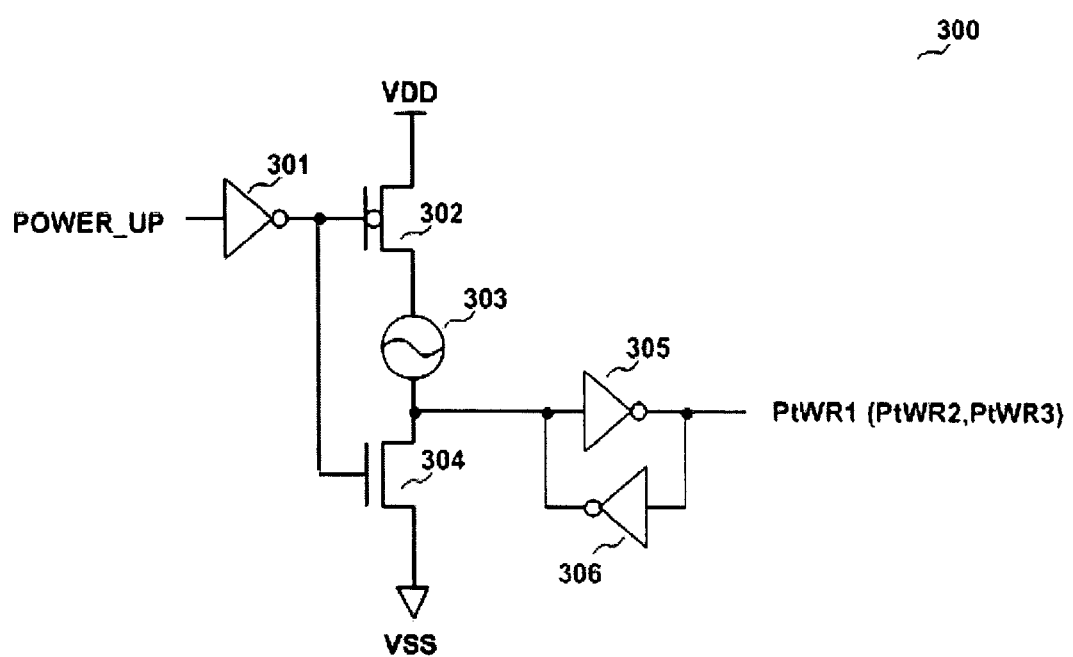
FIG. 11 is a circuit diagram illustrating a write recovery time enable signal generator in a semiconductor device according to an embodiment of the present invention.

FIG. 11 is a circuit diagram of a write recovery time enable signal generator in a semiconductor device according to an embodiment of the present invention. By constructing the write recovery time enable signal generator 300 as many as the number of kinds relative to values of the write recovery time (tWR), a desired value of the write recovery time (tWR) can be set.

As shown in FIG. 11, the write recovery time enable signal 300 includes a PMOS transistor 302 into which an inverted signal of a write recovery time determination signal POWER_UP, inverted by inverter 301 is input, an NMOS transistor 304 into which the inverted signal of a write recovery time determination signal POWER_UP is input, a fuse 303 connected between the PMOS transistor 302 and the NMOS transistor 304 for electrically isolating the NMOS transistor 302 from the NMOS transistor 304 if necessary, and an inverter 305 connected to a point between the fuse 303 and the NMOS transistor 304.

In the write recovery time enable signal generator 300, when the write recovery time determination signal POWER_UP is low, its inverted signal is high, and accordingly the PMOS transistor 302 turns off and the NMOS transistor 304 turns on. Accordingly, since an input of the inverter 305 keeps low, the write recovery time enable signals PtWR1, PtWR2 and PtWR3 are activated.

On the other hand, in the write recovery time enable signal generator 300, when the write recovery time determination signal POWER_UP is high, its inverted signal is low, and accordingly the PMOS transistor 302 turns on and the NMOS transistor 304 turns off. Accordingly, since the input of the inverter 305 remains high, the write recovery time enable signals PtWR1, PtWR2 and PtWR3 are deactivated.

As charges are shared at a connection point between the fuse 303 and the NMOS transistor 304 by further connecting the inverter 305 to a second inverter 306 via a latch, the write recovery time enable signals PtWR1, PtWR2 and PtWR3 can be prevented from floating, a condition in which the logic state of the signal cannot be determined.

Since the second inverter 306 latches the write recovery time enable signals PtWR1, PtWR2 and PtWR3, widths of a PMOS transistor and an NMOS transistor constructing the second inverter 306 are preferably designed to be smaller than those in the inverter 305 for facilitating transition of the write recovery time enable signals PtWR1, PtWR2 and PtWR3.

The write recovery time enable signal generator 300 changes the write recovery time determination signal POWER_UP from low to high and keeps the signal POWER_UP high under a state that one fuse 303 corresponding to a value of the write recovery time is cut off and the other fuses 303 remain unchanged.

Accordingly, in the case that the fuse 303 is cut off, as the input of the inverter 305 becomes low under a state where the write recovery time determination signal POWER_UP is low, the write recovery time enable signals PtWR1, PtWR2 and PtWR3 are activated. At this time, even if the write recovery time determination signal POWER_UP changes into a high state, since the fuser 303 electrically isolate the PMOS transistor 302 from the NMOS transistor 304, the input of the inverter 305 remains low and the write recovery time enable signals PtWR1, PtWR2 and PtWR3 remain activated.

On the other hand, in the case that the fuse 303 is not cut off, as the input of the inverter 305 becomes low under a state where the write recovery time determination signal POWER_UP is low, the write recovery time enable signals PtWR1, PtWR2 and PtWR3 are activated. However, if the write recovery time determination signal POWER_UP is changed into a high state, since the PMOS transistor 302 and the NMOS transistor 304 are electrically connected to each other and accordingly the input of the inverter 305 is changed in a high state, the write recovery time enable signals PtWR1, PtWR2 and PtWR3 are deactivated.

Figure 12:
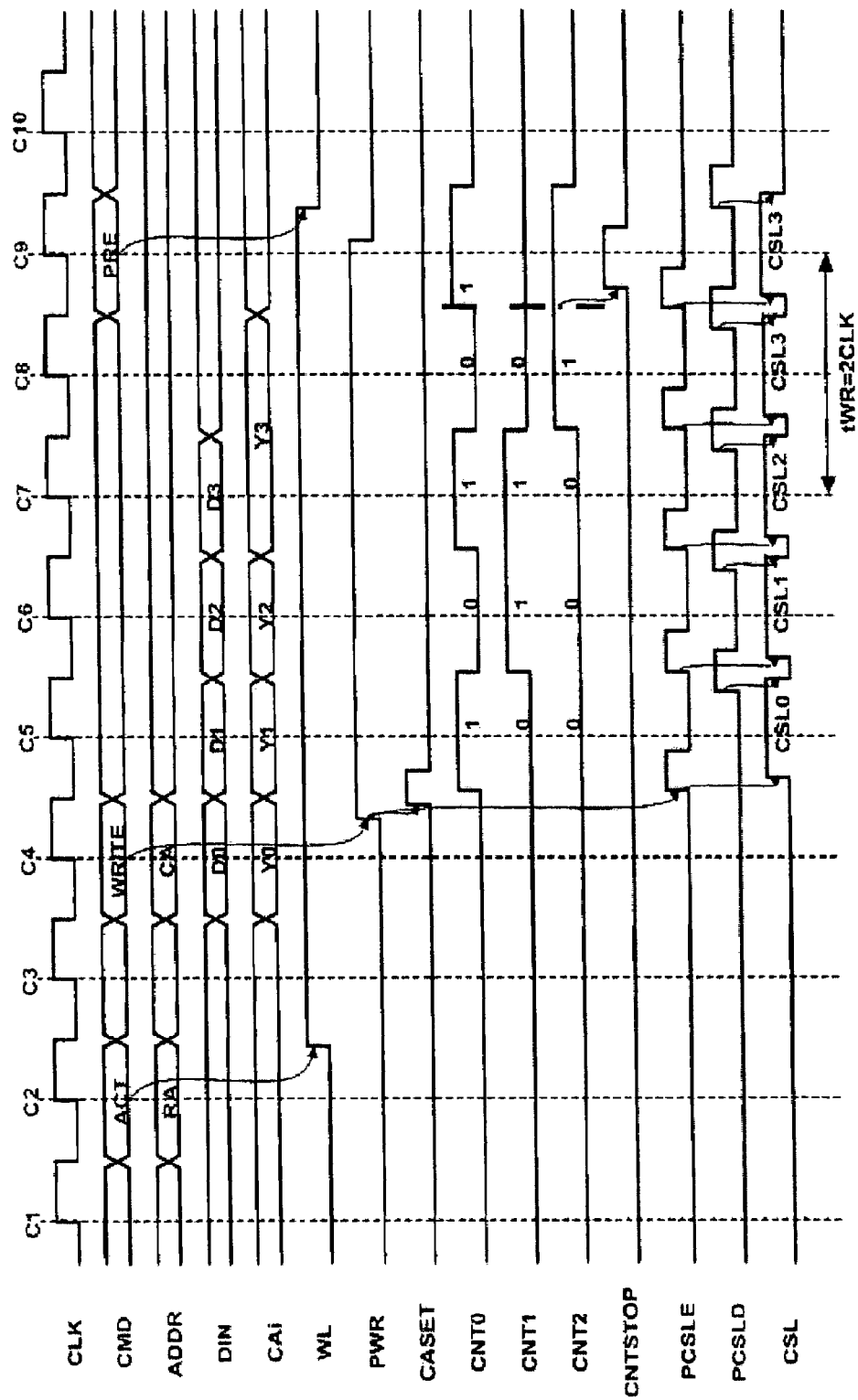
FIG. 12 is a timing diagram showing a write operation of a semiconductor device (in the case of tWR=2 clocks) according to an embodiment of the present invention.

FIG. 12 is a timing diagram showing a write operation of a semiconductor device (in the case of tWR=2 clocks) according to an embodiment of the present invention. As shown in FIG. 12, when the activation command signal ACT and the external address signal RA are input at C2 of the master clock signal CLK, the master clock signal CLK having intervals C1–C10 the semiconductor device according to the embodiment of the present invention sets to be activated and the word line signal WL corresponding to the external address signal is activated. The word line signal WL is deactivated by the pre-charge command signal PRE.

When the write command signal WRITE and the external address signal CA are input at C4 of the master clock signal CLK, the column address signal CAi into which first data are written is activated. When the write command signal WRITE is input, the write enable signal PWR is activated, and accordingly the column address set signal CASET is activated.

The column address burst counter output signals CNT0, CNT1 and CNT2 are activated by the write enable signal PWR. The first column address burst counter output signal CNT0 is activated by counting the master clock signal CLK, the second column address burst counter output signal CNT1 is activated by counting the first column address burst counter output signal CNT0, and the third column address burst counter output signal CNT2 is activated by counting the second column address burst counter output signal CNT1.

After the column address signal CAi into which the first data is written is activated, next column address signals CAi are activated by the column address burst counter output signals.

The stop signal CNTSTOP of the column address burst counter is activated by a signal derived from an AND operation of an AND gate with respect to the third column address burst counter output signal CNT2 and the first column address burst counter output signal CNT0, and accordingly the write enable signal PWR is deactivated.

The column selection line enable signal PCSLE and the column selection line disable signal PCSLD are activated by the write enable signal PWR, and the column selection line signal CSL is activated by the column selection line enable signal PCSLE and is deactivated by the column selection line disable signal PCSLD.

According to the present invention described above, by repeatedly activating only the column line into which the last data are written during a write recovery time (tWR), the last data voltage can be sufficiently supplied to memory cell arrays, and in addition, the time when a column line into which the last data are written is activated can be adjusted based on the value of the write recovery time (tWR).

Although the present invention has been described in connection with the preferred embodiments of the present invention, it is not limited thereto. It will be apparent to those skilled in the art that various modifications and changes may be made thereto without departing from the scope and spirit of the invention.

What is claimed is:

1. A semiconductor device, comprising:
   a memory cell array having a plurality of cell units;
   a bit line amplifier for amplifying a voltage difference between a bit line voltage and a complementary bit line voltage of the memory cell array;
   switching devices activated by a column selection line signal provided during a write time and a write recovery time for electrically connecting a data line and a complementary data line to the bit line and the complementary bit line, respectively; and
   a write driver for supplying a write data voltage to the data line and the complementary data line during the write time and resupplying the last write data voltage to the data line and the complementary data line during the write recovery time.

2. The semiconductor device as claimed in claim 1, wherein the column selection line signal is repetitively generated during the write recovery time.

3. The semiconductor device as claimed in claim 2, further comprising a signal generator for generating the colunm selection line signal,
   wherein the signal generator is activated by a signal derived from an AND operation of an AND gate with respect to a column selection line enable signal and a column address selection signal activated by a column address signal and is deactivated by a column selection line disable signal, for generating the column selection line signal.

4. The semiconductor device as claimed in claim 3, wherein the column selection disable signal is generated after the column selection line enable signal is generated.

5. The semiconductor device as claimed in claim 4, wherein the column selection line disable signal is generated with a delay by at least half of the period of the column selection line enable signal, compared to the column selection line enable signal.

6. The semiconductor device as claimed in claim 3, wherein the signal generator comprises:
   a first PMOS transistor into which a signal, derived from an AND operation of an AND gate with respect to the column selection line enable signal and the column address selection signal, is input;
   an NMOS transistor into which the signal derived from the AND operation of the AND gate with respect to the column selection line enable signal and the column address selection signal is input;
   a second PMOS transistor connected between the first PMOS transistor and the NMOS transistor and into which an inverted signal of the column selection line disable signal is input; and
   an inverter connected to a point between the second PMOS transistor and the NMOS transistor.

7. The semiconductor device as claimed in claim 6, wherein the signal generator further comprises a second inverter connected to the inverter via a latch.

8. The semiconductor device as claimed in claim 3, wherein the column selection line enable signal is generated by an AND operation of an AND gate with respect to a write enable signal and a master clock signal.

9. The semiconductor device as claimed in claim 3, wherein the column selection line disable signal is generated by an AND operation of an AND gate with respect to the master clock signal after a predetermined delay time and a write enable signal activated by an inverted signal of the master clock signal.

10. The semiconductor device as claimed in claim 1, further comprising a signal generator for generating a write enable signal,
    wherein the signal generator is activated by a write command signal and is deactivated by a stop signal of a column address burst counter.

11. The semiconductor device as claimed in claim 10, wherein the signal generator comprises:
    a first NOR gate into which the write command signal is input;
    a second NOR gate connected to the first NOR gate via a latch and into which the stop signal of the column address burst counter is input; and
    an inverter connected to an output terminal of the first NOR gate.

12. The semiconductor device as claimed in claim 10, wherein the stop signal of the colunm address burst counter is generated with a delay by at least one clock of a master clock signal after a start of the write recovery time.

13. The semiconductor device as claimed in claim 12, wherein the stop signal of the column address burst counter is generated with a delay in proportion to a value of the write recovery time.

14. The semiconductor device as claimed in claim 13, wherein the stop signal of the column address burst counter is activated by a write recovery time enable signal.

15. The semiconductor device as claimed in claim 14, further comprising a signal generator for generating the write recovery time enable signal,
    wherein the signal generator comprises:
    a PMOS transistor into which an inverted signal of a write recovery time determination signal is input;
    an NMOS transistor into which the inverted signal of the write recovery time determination signal is input;
    a fuse connected between the PMOS transistor and the NMOS transistor; and
    an inverter connected to a connection point between the fuse and the NMOS transistor.

16. The semiconductor device as claimed in claim 15, wherein the signal generator further comprises a second inverter connected to the inverter via a latch.

17. The semiconductor device as claimed in claim 3, wherein an internal column address signal is generated after the column address signal is generated after a predetermined delay time.

18. The semiconductor device as claimed in claim 17, wherein the column address signal is reset by the stop signal of the column address burst counter.

19. The semiconductor device as claimed in claim 18, wherein the column address signal is activated by a column address set signal and is generated after the predetermined delay time.

20. The semiconductor device as claimed in claim 19, wherein the column address signal is activated by a signal derived from an AND operation of an AND gate with respect to the master clock signal and an inverted signal of the column address set signal and the internal column address signal is generated.

21. The semiconductor device as claimed in claim 20, wherein the column address signal is generated during at least one clock of the master clock signal after a start of the write recovery time.

22. The semiconductor device as claimed in claim 21, wherein the column address signal is generated in proportion to a value of the write recovery time.

23. The semiconductor device as claimed in claim 19, wherein the column address set signal is activated by a write enable signal and is deactivated after a predetermined delay time.

24. A method of controlling a semiconductor device, including a memory cell array consisting of a plurality of cell units, a bit line amplifier for amplifying a voltage difference between a bit line voltage and a complementary bit line voltage of the memory cell array, switching devices activated by a column selection line signal provided during a write time and a write recovery time for electrically connecting a data line and a complementary data line to the bit line and the complementary bit line, respectively, and a write driver for supplying a write data voltage to the data line and the complementary data line during the write time and resupplying the last write data voltage to the data line and the complementary data line during a write recovery time, comprising the steps of:
  writing the data voltage into the memory cell array during the write time; and
  providing the column selection line signal during the write recovery time and rewriting the last data voltage during the write recovery time.

25. The method as claimed in claim 24, wherein the step of generating the column selection line signal includes generating the column selection line signal repetitively.

26. The method as claimed in claim 25, wherein the step of generating the column selection line signal includes activating the colunm selection line signal using a write enable signal.

27. The method as claimed in claim 26, wherein the step of generating the column selection line signal includes generating the write enable signal during at least one clock of a master clock signal after a start of the write recovery time.

28. The method as claimed in claim 27, wherein the step of generating the column selection line signal includes generating the write enable signal in proportion to a value of the write recovery time.

29. The method as claimed in claim 28, wherein the step of generating the column selection line signal includes deactivating the write enable signal using a stop signal of a column address burst counter.

30. The method as claimed in claim 29, wherein the step of generating the column selection line signal includes generating the stop signal of the column address burst counter with a delay by at least one clock of the master clock signal after a start of the write recovery time.

31. The method as claimed in claim 30, wherein the step of generating the column selection line signal includes generating the stop signal of the column address burst counter in proportion to a value of the write recovery time.

* * * * *